US010284188B1

(12) United States Patent
Soundararajan et al.

(10) Patent No.: US 10,284,188 B1
(45) Date of Patent: May 7, 2019

(54) DELAY BASED COMPARATOR

(71) Applicant: TEXAS INSTRUMENTS INCORPORATED, Dallas, TX (US)

(72) Inventors: Rishi Soundararajan, Bengaluru (IN); Visvesvaraya Pentakota, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/945,165

(22) Filed: Apr. 4, 2018

Related U.S. Application Data

(60) Provisional application No. 62/611,558, filed on Dec. 29, 2017.

(51) Int. Cl.
   *H03K 5/24* (2006.01)
   *H03M 1/50* (2006.01)
   *H03K 5/00* (2006.01)

(52) U.S. Cl.
   CPC ............. *H03K 5/249* (2013.01); *H03M 1/50* (2013.01); *H03K 2005/00215* (2013.01)

(58) Field of Classification Search
   CPC .......... H03K 5/249; H03M 1/50; H03M 1/52; H03M 1/54
   See application file for complete search history.

(56) References Cited

U.S. PATENT DOCUMENTS

| | | | | |
|---|---|---|---|---|
| 5,317,721 A * | 5/1994 | Robinson | ............ | G06F 13/4217 710/107 |
| 5,563,533 A * | 10/1996 | Cave | ................ | H03K 3/356113 327/205 |
| 5,821,780 A * | 10/1998 | Hasegawa | ............ | H03K 5/2445 327/63 |
| 6,046,612 A * | 4/2000 | Taft | ....................... | G11C 27/026 327/337 |
| 6,822,596 B2 * | 11/2004 | Theiler | ................... | H03M 1/64 341/111 |
| 7,916,064 B2 * | 3/2011 | Lin | ........................ | H03M 1/50 341/155 |
| 8,130,130 B2 * | 3/2012 | Danjo | .................... | H03K 5/249 341/155 |
| 8,373,444 B2 * | 2/2013 | Lee | ......................... | H03M 1/50 327/104 |
| 8,773,169 B2 * | 7/2014 | Dinc | ....................... | H03K 3/011 327/65 |
| 8,836,375 B2 * | 9/2014 | Ghatak | ................... | H03K 5/249 327/65 |
| 9,455,695 B2 * | 9/2016 | Kull | ........................ | H03K 5/249 |
| 2013/0009796 A1 * | 1/2013 | Sakiyama | ........... | H03M 1/0624 341/110 |

\* cited by examiner

*Primary Examiner* — Thomas J. Hiltunen
(74) *Attorney, Agent, or Firm* — John R. Pessetto; Charles A. Brill; Frank D. Cimino

(57) ABSTRACT

A comparator includes a pair of back-to-back negative-AND (NAND) gates and a delay circuit coupled to the pair of back-to-back NAND gates. The delay circuit is configured to modulate a triggering clock signal by an input voltage to generate a delayed clock signal with a delay that is based on the input voltage. Each of the pair of back-to-back NAND gates is configured to receive the delayed clock signal and generate a comparator output signal based on the delayed clock signal.

11 Claims, 4 Drawing Sheets

US 10,284,188 B1

DELAY BASED COMPARATOR

CROSS-REFERENCE TO RELATED APPLICATIONS

The present application claims priority to U.S. Provisional Patent Application No. 62/611,558, filed Dec. 29, 2017, titled "Delayed Based Comparator," which is hereby incorporated herein by reference in its entirety.

BACKGROUND

Analog comparators are relatively common electronic circuits that are used in a wide-variety of applications to compare the amplitude of two signals. Latched comparators are a type of comparator that use positive feedback to maintain an output state of the comparator. For example, output state change of a latched comparator may be triggered by a transition or state of a dock signal. After the output state change, the output state of the comparator is maintained by positive feedback and the remainder of the comparator circuitry may operate at a reduced power level. Latched comparators are often used in event driven or power sensitive applications, such as analog-to-digital converters (ADCs).

SUMMARY

In accordance with at least one aspect of the disclosure, a comparator includes a pair of back-to-back negative-AND (NAND) gates and a delay circuit coupled to the pair of back-to-back NAND gates. The delay circuit is configured to modulate a triggering clock signal by an input voltage to generate a delayed clock signal with a delay that is based on the input voltage. Each of the pair of back-to-back NAND gates is configured to receive the delayed clock signal and generate a comparator output signal based on the delayed clock signal.

Another aspect of the disclosure is a delay circuit that includes a first inverter, a second inverter, and a pair of cross-coupled capacitors. The first inverter is coupled to a first transistor and a second transistor. The first inverter is configured to receive a first intermediate delayed clock signal and generate a positive delayed clock signal to be received by a first NAND gate of a comparator. The second inverter is coupled to a third transistor and a fourth transistor. The second inverter is configured to receive a second intermediate delayed clock signal and generate a negative delayed clock signal to be received by a second NAND gate of the comparator. The pair of cross-coupled capacitors are coupled to the first and second inverters.

Yet another aspect of the disclosure is a comparator that includes a differential input pair of transistors and a delay circuit. The differential input pair of transistors includes a first input transistor and a second input transistor. The delay circuit includes a first inverter, a second inverter, and a pair of cross-coupled capacitors. The first inverter is coupled to a first transistor and a second transistor. The first inverter is configured to receive a first intermediate delayed clock signal and generate a positive delayed clock signal to be received by the first input transistor. The second inverter is coupled to a third transistor and a fourth transistor. The second inverter is configured to receive a second intermediate delayed clock signal and generate a negative delayed clock signal to be received by the second input transistor. The pair of cross-coupled capacitors are coupled to the first and second inverters.

BRIEF DESCRIPTION OF THE DRAWINGS

For a detailed description of various examples, reference will now be made to the accompanying drawings in which.

NOTATION AND NOMENCLATURE

Figure 1:
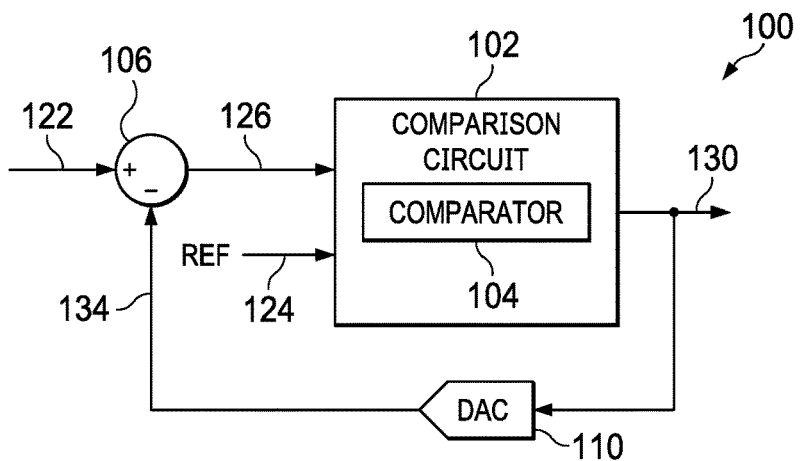
FIG. 1 shows an illustrative block diagram of an ADC in accordance with various examples.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various examples of the disclosure. Although one or more of these examples may be preferred, the examples disclosed should not be interpreted, or otherwise used, as limiting the scope of the disclosure, including the claims. In addition, one skilled in the art will understand that the following description has broad application, and the discussion of any example is meant only to be exemplary of that example, and not intended to intimate that the scope of the disclosure, including the claims, is limited to that example.

ADCs are used to convert analog signals into a digital representation of the same signal. ADCs are used in a wide variety of applications, ranging from medical and entertainment to communications (both voice and data). One key design block of any ADC is the comparator. The comparator generates digital output signals based on the comparison of an analog input signal with a reference voltage.

For example, in a SAR ADC, the comparator compares a sampled analog input signal to the analog output of an internal DAC and outputs a digital output signal to a SAR circuit that generates a digital code of the analog input signal voltage which is provided to the DAC. The SAR circuit is initialized so that the most significant bit (MSB) is equal to digital one. This digital code is output into the DAC which converts the digital code into an analog equivalent based on a reference signal. The DAC's analog output is then received by the comparator. If the analog input signal has a voltage that is greater than the voltage of the DAC's analog output, the comparator will output a HIGH signal (thus causing the SAR to keep the MSB as one); however, if the analog signal has a voltage that is less than the voltage of the DAC's analog output, the comparator will output a LOW signal (thus causing the SAR to reset the MSB as zero). Each bit in the SAR is tested in a similar manner against the analog input signal by the comparator until every bit has been set. The resulting code is output as the digital output signal that represents the analog input signal. Comparators are similarly important in sigma-delta modulated ADCs, flash ADCs, high speed radio frequency (RF) sampling converters, etc.

Because the comparator is essential to ADCs, the speed of the comparator affects the speed of the entire ADC. In other words, by increasing the speed of the comparator, the speed of the ADC may also be increased. Conventional high speed ADCs include comparators that require input information (e.g., the analog input signal and reference signal) until the comparator gives a valid decision (e.g., generates the output signal). In 65 nm technology, the time for a comparator to make a decision is typically greater than 100 ps. Therefore, ADCs using conventional comparators typically require an amplifier that drives the comparators to hold the input for at least 100 ps. In other words, conventional systems require the amplifier that drives the comparator to hold the input signal for a relatively long period of time. Therefore, the operation of the ADC is slowed. Furthermore, because the input signal is held for a relatively long period of time, timing complexities are introduced into these conventional systems.

In accordance with various examples, a relatively high speed latch comparator is provided. Such a comparator includes, in various examples, a voltage controlled delay circuit that converts the input voltage information into time information. The input clock of the comparator (LATP) is delayed by the delay circuit in proportion to the input voltage. Therefore, the delayed input signals (which can include a pair of differential delayed input signals (INPD and INMD) include the input information (e.g., input voltage) in the time domain. Depending on which of the signals INPD or INMD arrives at the latch first, the latch triggers, allowing the comparator to generate an output signal. For such a comparator, the delay generated by the delay circuit is relatively low (e.g., approximately 25 ps). Furthermore, input voltage movements (e.g., change in the input voltage) after the signals INPD and INMD are generated will not affect the decision of the comparator (e.g., will not affect the outputted signal). Therefore, input information is not needed when the comparator is making a decision. In this way, the speed of the comparator is increased, and timing complexities are reduced. Additionally, the input information is not corrupted during processing.

FIG. 1 shows an illustrative block diagram of an ADC 100 in accordance with various examples. The ADC 100 includes, in an embodiment, a comparison circuit 102, DAC 110, and a summation circuit 106. The summation circuit 106 is configured to receive an analog input signal 122 (e.g., a time-varying analog voltage) and an analog feedback signal 134 which is an analog version of the comparison circuit output signal 130. The summation circuit 106 is further configured to sum the analog input signal 122 and the analog feedback signal 134 to generate the summed analog signal 126.

The comparison circuit 102 includes at least one comparator 104. For example, the comparator 104 can be configured to compare the summed analog input signal 126 with a reference signal 124 and generate a digital comparison circuit output signal 130. Thus, for example, if the summed analog input signal 126, which corresponds with the analog input signal 122, has a voltage that is greater than the voltage of the reference signal 124, the comparator 104 will output a HIGH signal as the digital comparison circuit output signal 130; however, if the summed analog input signal 126 has a voltage, that is less than the voltage of the reference signal 124, the comparator 104 will output a LOW signal as the digital comparison circuit output signal 130. The DAC 110 receives the digital comparison circuit output signal 130 and generates an analog version of the digital comparison circuit output signal 130 as the analog feedback signal 134.

As discussed above, the comparator 104 can be one of numerous comparators in the comparison circuit 102. Thus, for example, the comparison circuit 102 can include a number of comparators that generate separate bits of the digital comparison circuit output signal 130.

Figure 2:
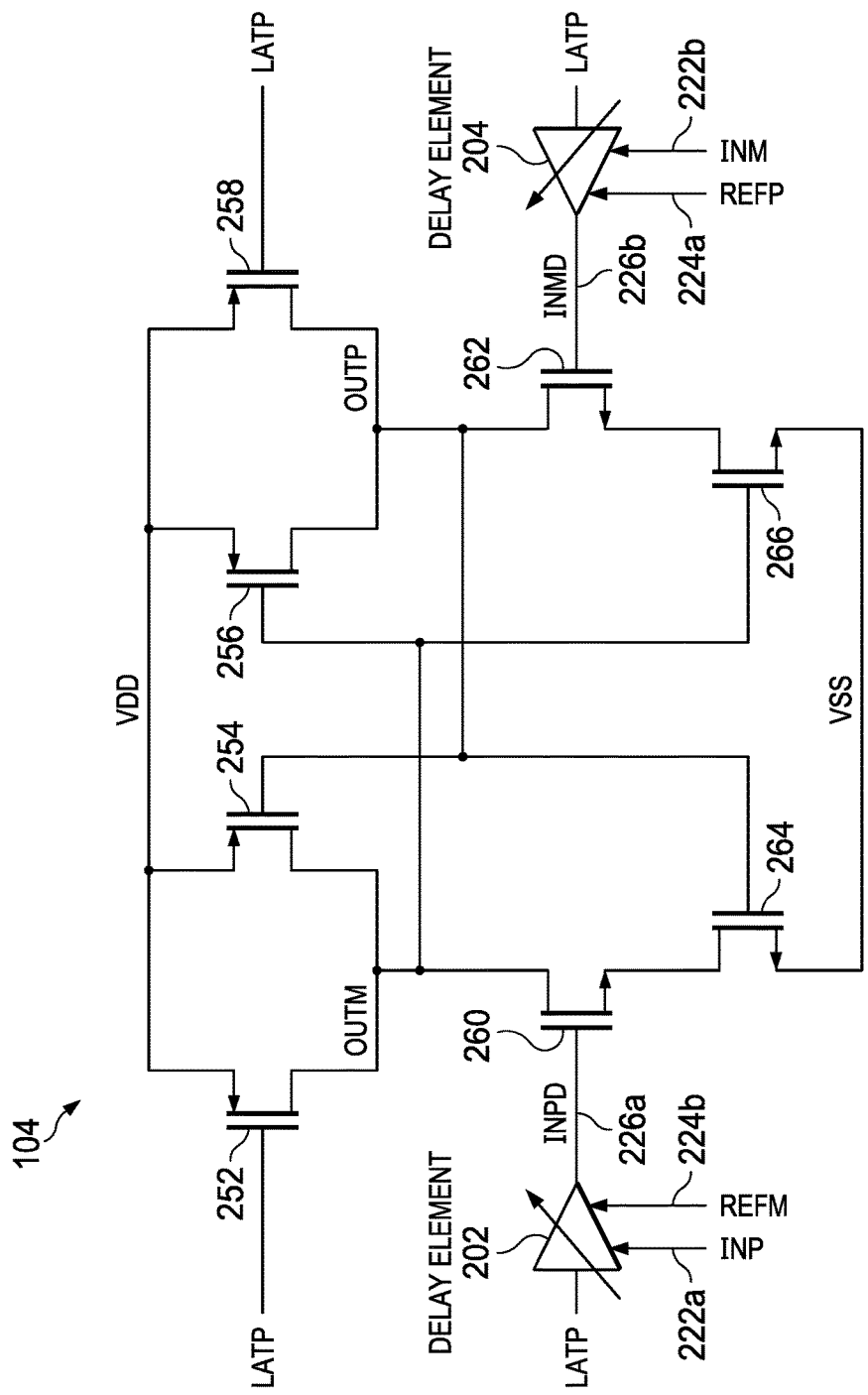
FIG. 2 shows an illustrative circuit diagram of a comparator in accordance with various examples.

FIG. 2 shows an illustrative circuit diagram of comparator 104 in accordance with various examples. The comparator 104 includes, in an example, a pair of back-to-back negative-AND (NAND) gates that are made up of the differential input pair of transistors 260-262 and the regeneration transistors 254-256 and 264-266. For example, one NAND gate can include the transistors 254, 260, and 264 while the second NAND gate can include the transistors 256, 262, and 266. The comparator 104 also includes timing transistors 252 and 258 which are configured to receive the triggering clock signal LATP and delay elements 202-204. The delay elements 202-204 are coupled to the back-to-back NAND gates and are configured to modulate the triggering clock signal LATP by an input voltage to generate a delayed clock signal with a delay that is based on the input voltage. For example, the input voltage received by the comparator 104 can be a differential signal composed of the positive input signal (INP) 222a and the negative input signal (INM) 222b. More particularly, the delay element 202 is configured to receive INP 222a while delay element 204 is configured to receive INM 222b. Additionally, the delay elements 202-204 are configured to receive a reference signal, which, in an example, is a differential signal composed of the positive reference signal (REFP) 224a and the negative reference signal (REFM) 224b. More particularly, the delay element 202 is configured to receive REFM 224b while delay element 204 is configured to receive REFP 224a. In some examples, the reference signals REFP 224a and REFM 224b are set so that the threshold of the comparator 104 is equal to the voltage of REFP 224a minus the voltage of REFM 224b.

The delay element 202 is configured to generate a positive delayed clock signal (INPD) 226a whose delay is proportional to the voltage level of the INP 222a. In other words, the input transistor 260 receives a delayed version of the triggering clock signal LATP, the delay amount being proportional to INP 222a. The delay element 204 is configured to generate a negative delayed clock signal (INMD) 226b whose delay is proportional to the voltage level of INM 222b. In other words, the input transistor 262 receives a delayed version of the triggering clock signal LATP, the delay amount being proportional to INM 222b. In this way, the delay in the delayed clock signal is proportional to the input voltage. In other words, the input voltage signal is converted into time information before being processed by the back-to-back NAND gates.

Figure 3:
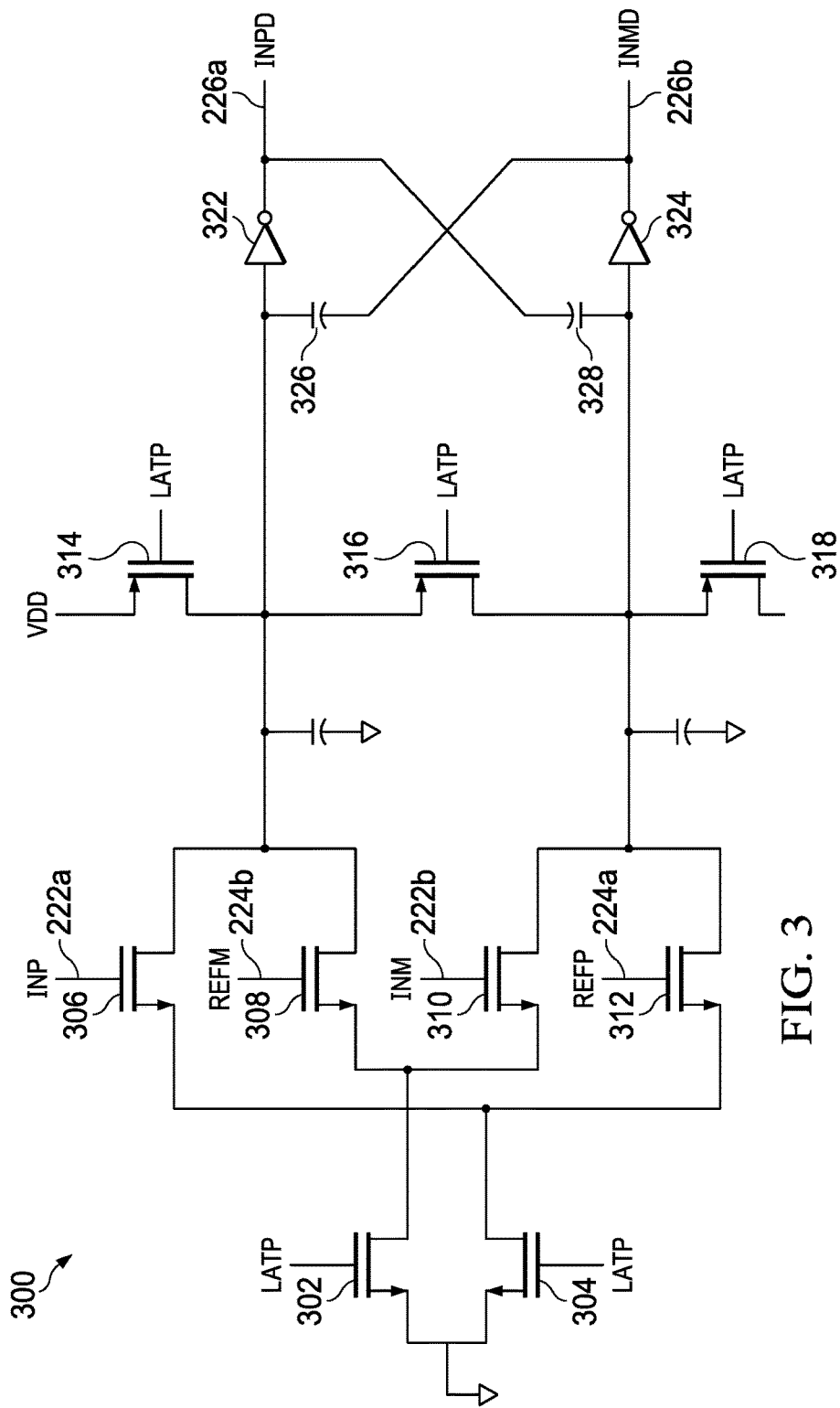
FIG. 3 shows an illustrative circuit diagram for a delay circuit of a comparator in accordance with various examples.

FIG. 3 shows an illustrative circuit diagram for a delay circuit 300 of comparator 104 in accordance with various examples. The delay circuit 300 can include the delay elements 202-204 shown in FIG. 2. The delay circuit 300 includes, in an example, the transistors 302-318, inverters 322-324, and a pair of cross-coupled capacitors that include capacitors 326-328. In some examples, the transistors 302-312 are n-channel metal-oxide-semiconductor field-effect (NMOS) transistors. However, in other examples, the transistors 302-312 can be p-channel metal-oxide-semiconductor field-effect (PMOS) transistors, bipolar junction transistors (BJTs) or any combination thereof (e.g., a combination of NMOS transistors and PMOS transistors). The transistors 314-318 are, in an example, PMOS transistors; however, the transistors 314-318 can be NMOS transistors, BJTs or any combination thereof (e.g., a combination of NMOS transistors and PMOS transistors).

The transistors 302-304 are configured to receive the triggering clock signal LATP which then is provided to the transistors 306-312. More particularly, transistors 306-308 are in parallel with one another, and transistors 310-312 are in parallel with one another. The transistor 306 is configured to receive at its gate INP 222a. Therefore, the resistance of the transistor 306 is proportional to the voltage level of INP 222a. The transistor 308 is configured to receive at its gate REFM 224b. Therefore, the resistance of the transistor 308 is proportional to the voltage level of REFM 224b. Transistor 310 is configured to receive at its gate INM 222b. Therefore, the resistance of the transistor 310 is proportional to the voltage level of INM 222b. Transistor 312 is configured to receive at its gate REFP 224a. Therefore, the resistance of the transistor 312 is proportional to the voltage level of REFP 224a.

For example, the parallel transistors 306-308 receive the triggering clock signal LATP and generate an intermediate delayed clock signal 352a (a delayed version of LATP) that is based on the resistance of the parallel transistors 306-308 (and thus based on the voltage level of INP 222a and REFM 224b). Thus, if the resistance of the parallel transistors 306-308 is relatively large, then the delay in LATP will be relatively large in the resulting intermediate delayed clock signal 352a. However, if the resistance of the parallel transistors 306-308 is relatively small, then the delay in LATP will be relatively small in the resulting intermediate delayed clock signal 352a. In this way, the resistance (caused by the voltage levels of INP 222a and REFM 224b) of the parallel transistors 306-308 determines the delay in the intermediate delayed clock signal 352a and thus, INPD 226a.

Similarly, the parallel transistors 310-312 receive the triggering clock signal LATP and generate an intermediate delayed clock signal 352b (a delayed version of LATP) that is based on the resistance of the parallel transistors 310-312 (and thus based on the voltage level of INM 222b and REFP 224a). Thus, if the resistance of the parallel transistors 310-312 is relatively large, then the delay in LATP will be relatively large in the resulting intermediate delayed clock signal 352b. However, if the resistance of the parallel transistors 310-312 is relatively small, then the delay in LATP will be relatively small in the resulting intermediate delayed clock signal 352b. In this way, the resistance (caused by the voltage levels of INM 222b and REFP 224a) of the parallel transistors 310-312 determines the delay in the intermediate delayed clock signal 352b and thus, INMD 226b.

The delay difference between the intermediate delayed clock signal 352a and the intermediate delayed clock signal 352b can be relatively small; therefore, the pair of cross-coupled capacitors that includes the capacitors 326-328 are included in some examples to provide more resolution in the delay difference between INPD 226a and INMD 226b. For example, the inverter 322 is configured, in an example, to receive the intermediate delayed clock signal 352a from the parallel transistors 306-308 and invert the intermediate delayed clock signal 352a to generate INPD 226a. Similarly, the inverter 324 is configured, in an example, to receive the intermediate delayed clock signal 352b from the parallel transistors 310-312 and invert the intermediate delayed clock signal 352b to generate INMD 226b. Due to the presence of the capacitors 326-328 in a cross-coupled configuration, if INPD 226a transitions HIGH before INMD 226b transitions HIGH, then the transition of INMD 226b to HIGH is delayed. Similarly, if INMD 226b transitions HIGH before INPD 226a transitions HIGH, then the transition of INPD 226a to HIGH is delayed. The higher resolution in the delay difference between INPD 226a and INMD 226b enables the comparator 104 to provide an accurate decision as its output signal.

In one specific example to generate a high resolution delay difference between INPD 226a and INMD 226b, the drains of transistors 306-308 are connected to the input terminal of inverter 322 and a first terminal of capacitor 326. Thus, the first terminal of capacitor 326 is connected to the input terminal of inverter 322. The drains of transistors 310-312 are connected to the input terminal of inverter 324 and a first terminal of capacitor 328. Thus, the first terminal of capacitor 328 is connected to the input terminal of inverter 324. The second terminal of capacitor 326 is connected to the output terminal of inverter 324 and thus, to INMD 226b. The second terminal of capacitor 328 is connected to the output terminal of inverter 322 and thus, to INPD 226a.

Figure 4A:
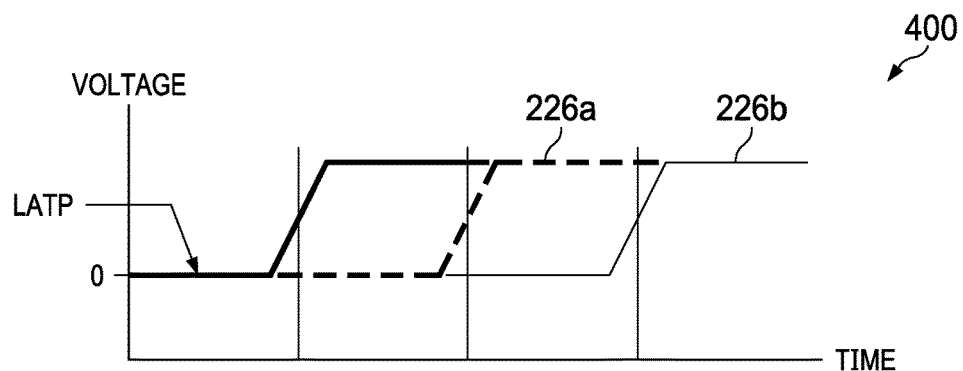
FIG. 4A shows an illustrative timing diagram of various signals in a delay circuit of a comparator in accordance with various examples.

FIG. 4A shows an illustrative timing diagram 400 of LATP, INPD 226a, and INMD 226b in delay circuit 300 of comparator 104 in accordance with various examples. More particularly, the timing diagram 400 shows the timing of the signals LATP, INPD 226a, and INMD 226b if the voltage of INP 222a minus the voltage of INM 222b is greater than the voltage of REFP 224a minus the voltage of REFM 224b (i.e., (INP−INM)>(REFP−REFM)). Thus, as shown in FIG. 4A, when (INP−INM)>(REFP−REFM), INPD 226a triggers before INMD 226b triggers.

Figure 4B:
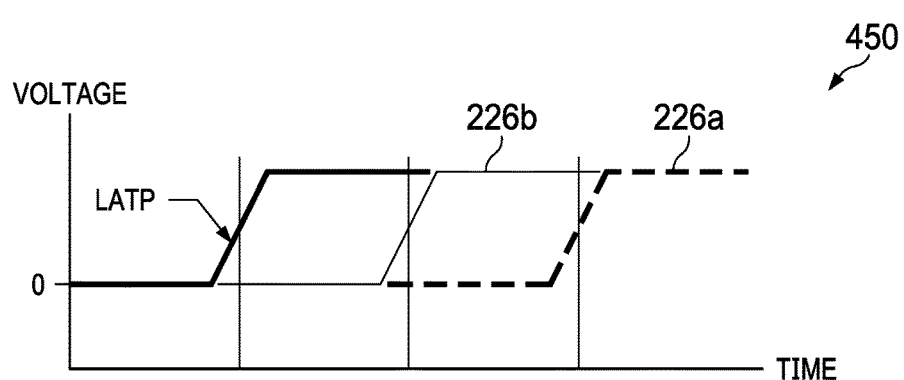
FIG. 4B shows an illustrative timing diagram of various signals in a delay circuit of a comparator in accordance with various examples.

FIG. 4B shows an illustrative timing diagram 450 of LATP, INPD 226a, and INMD 226b in delay circuit 300 of comparator 104 in accordance with various examples. More particularly, the timing diagram 450 shows the timing of the signals LATP, INPD 226a, and INMD 226b if the voltage of INP 222a minus the voltage of INM 222b is less than the voltage of REFP 224a minus the voltage of REFM 224b (i.e., (INP−INM)<(REFP−REFM)). Thus, as shown in FIG. 4B, when (INP−INM)<(REFP−REFM), INMD 226b triggers before INPD 226a triggers.

Figure 5:
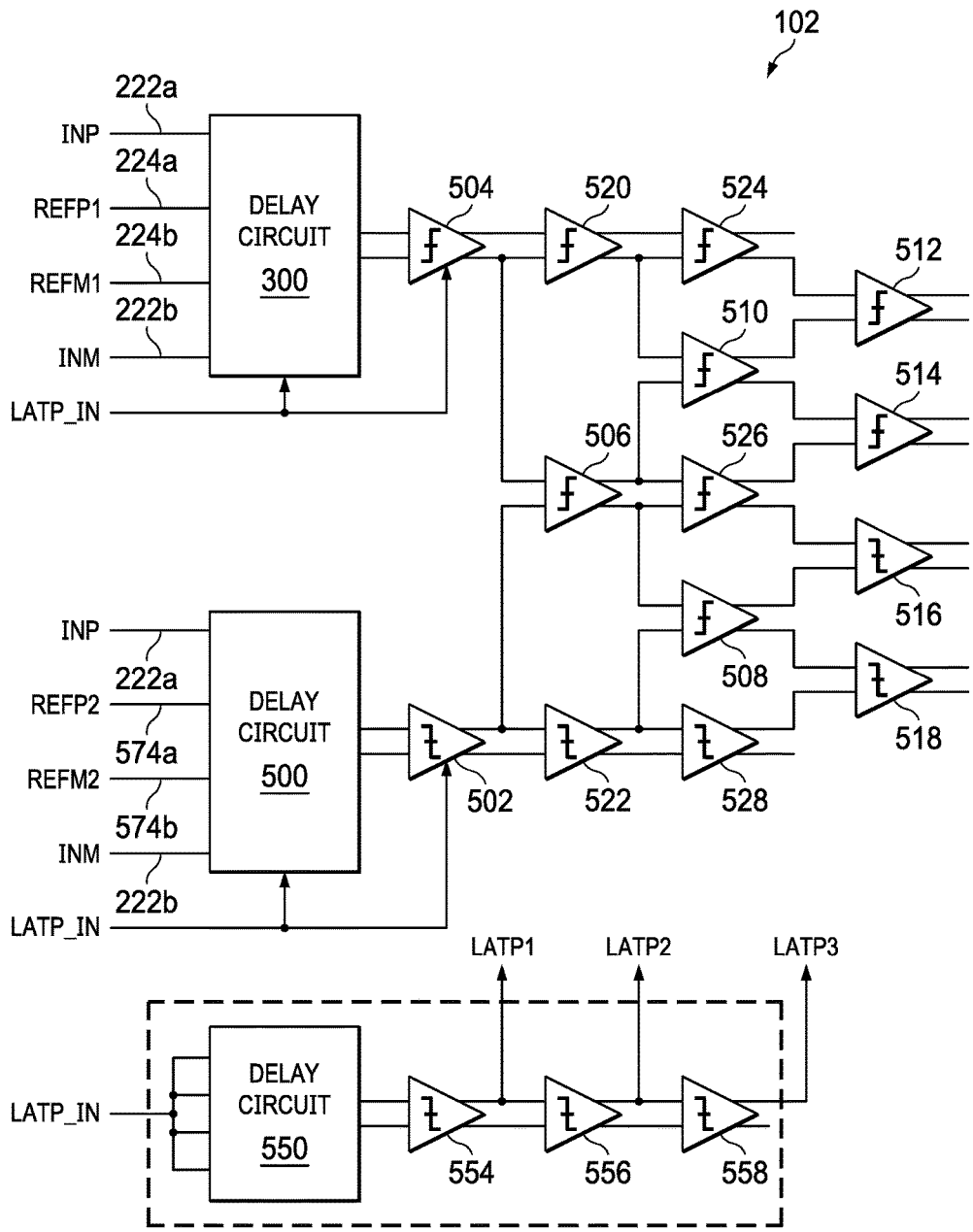
FIG. 5 shows an illustrative block diagram of a flash ADC comparison circuit in accordance with various examples.

FIG. 5 shows an illustrative block diagram of flash ADC comparison circuit 102 in accordance with various examples. The example comparison circuit 102 includes, in an example, delay circuits 300, 500, and 550, first level comparators 502-504 and 554, interpolation comparators 506-518, and dummy comparators 520-528 and 556-558. The comparators 502-528 and 554-556 are, in an example, similar to the comparator 104 from FIG. 2 without the delay elements 202-204. The delay circuits 500 and 550 are similar, in an example, to the delay circuit 300 except with one or more different input signals. For example, while the delay circuit 300 receives INP 222a, INM 222b, REFP 224a, and REFM 224*b*, the delay circuit 500 receives different reference signals (e.g., REFP 574*a* and REFM 574*b*) in addition to INP 222*a* and INM 222*b* and the delay circuit 550 receives the triggering clock signal LATP-IN as the only input.

The comparators 554-558 are configured to generate triggering clock signals for successive levels of comparators, each level delayed from the previous level. For example, the clock signal LATP_IN is used as the triggering clock signal for the first level comparators 502-504, LATP1 is used as the triggering clock signal for the second level of comparators that includes interpolation comparator 506 and the dummy comparators 520-522, the triggering clock signal LATP2 is used as the triggering clock signal for the third level of comparators that includes interpolation comparators 508-510 and the dummy comparators 524-528, and the triggering clock signal LATP3 is used as the triggering clock signal for the fourth level of comparators that includes interpolation comparators 512-518.

The first level comparator 502 compares the positive delayed clock signal generated by the delay circuit 500 with the negative delayed clock signal generated by the delay circuit 500 and generates a differential comparator output signal (e.g., a positive comparator output signal and a negative comparator output signal). Similarly, the first level comparator 504 compares the positive delayed clock signal generated by the delay circuit 300 with the negative delayed clock signal generated by the delay circuit 300 and generates a differential comparator output signal (e.g., a positive comparator output signal and a negative comparator output signal). The interpolation comparator 506 receives the negative comparator output signal from the comparator 504 and the positive comparator output signal from the comparator 502 and generates a second level differential comparator output signal (e.g., a positive comparator output signal and a negative comparator output signal). The dummy comparators 520-522 are utilized to match the timing difference generated by the interpolation comparator 506 for the third level of comparators.

The third level of comparators works in a similar manner as the second level of comparators except that there are now two interpolation comparators (e.g., interpolation comparators 508-510). For example, the interpolation comparator 508 receives the negative comparator output signal from the interpolation comparator 506 and the positive comparator output signal from the dummy comparator 522 and generates a third level differential comparator output signal (e.g., a positive comparator output signal and a negative comparator output signal). The interpolation comparator 510 receives the positive comparator output signal from the interpolation comparator 506 and the negative comparator output signal from the dummy comparator 520 and generates a third level differential comparator output signal (e.g., a positive comparator output signal and a negative comparator output signal). The dummy comparators 524-528 are utilized to match the timing difference generated by the interpolation comparators 508-510 for the fourth level of comparators.

The fourth level of comparators works in a similar manner as the second level of comparators and the third level of comparators except that there are now four interpolation comparators (e.g., interpolation comparators 512-518). For example, the interpolation comparator 512 receives the negative comparator output signal from the dummy comparator 524 and the positive comparator output signal from the interpolation comparator 510 and generates a single bit differential comparator output signal (e.g., a positive comparator output signal and a negative comparator output signal) that makes up a single bit of the comparison circuit 102 output signal 130. The interpolation comparator 514 receives the negative comparator output signal from the interpolation comparator 510 and the positive comparator output signal from the dummy comparator 526 and generates a single bit differential comparator output signal (e.g., a positive comparator output signal and a negative comparator output signal) that makes up a single bit of the comparison circuit 102 output signal 130. The interpolation comparator 516 receives the negative comparator output signal from the dummy comparator 526 and the positive comparator output signal from the interpolation comparator 508 and generates a single bit differential comparator output signal (e.g., a positive comparator output signal and a negative comparator output signal) that makes up a single bit of the comparison circuit 102 output signal 130. The interpolation comparator 518 receives the negative comparator output signal from the interpolation comparator 508 and the positive comparator output signal from the dummy comparator 528 and generates a single bit differential comparator output signal (e.g., a positive comparator output signal and a negative comparator output signal) that makes up a single bit of the comparison circuit 102 output signal 130.

Thus, the input information (INP 222*a*, INM 222*b*, REFP 224*a*, REFP 224*b*, REFP 574*a*, and REFM 574*b*) is needed only for the duration of the delay element of the delay circuits 300 and 500 to modulate the input triggering clock LATP_IN. The entire conversion can follow asynchronous operation and thus, only one input triggering clock is needed. Furthermore, as the last level of comparators (e.g., the fourth level of comparators) is in a decision phase, the first level of comparators can begin processing the next input sample. Moreover, each level of interpolation gives a gain for the next level of comparators, thus, all the comparators need not be designed for noise.

The above discussion is meant to be illustrative of the principles and various examples of the present disclosure. Numerous variations and modifications will become apparent to those skilled in the art once the above disclosure is fully appreciated. It is intended that the following claims be interpreted to embrace all such variations and modifications.

What is claimed is:

1. A comparator, comprising:
   a pair of back-to-back negative-AND (NAND) gates; and
   a delay circuit coupled to the pair of back-to-back NAND gates, the delay circuit configured to modulate a triggering clock signal by an input voltage to generate a delayed clock signal with a delay that is based on the input voltage,
   wherein each of the pair of back-to-back NAND gates is configured to receive the delayed clock signal and generate a comparator output signal based on the delayed clock signal;
   wherein the input voltage is a differential signal that includes a positive input signal and a negative input signal;
   wherein the delay circuit is further configured to receive a differential reference signal that includes a positive reference signal and a negative reference signal;
   wherein the delay circuit includes:
   a first transistor configured to receive the positive input signal;
   a second transistor in parallel with the first transistor, the second transistor configured to receive the negative reference signal;

a third transistor configured to receive the negative input signal; and a fourth transistor in parallel with the third transistor, the fourth transistor configured to receive the positive reference signal.

2. The comparator of claim 1, wherein:

the delay in the delayed clock signal includes a positive delayed clock signal and a negative delayed clock signal;

the resistance of the first transistor in parallel with the second transistor determines a delay in the positive delayed clock signal; and the resistance of the third transistor in parallel with the fourth transistor determines a delay in the negative delayed clock signal.

3. The comparator of claim 2, wherein:

the resistance of the first transistor is proportional to a voltage level of the positive input signal;

the resistance of the second transistor is proportional to a voltage level of the negative reference signal;

the resistance of the third transistor is proportional to a voltage level of the negative input signal; and the resistance of the fourth transistor is proportional to a voltage level of the positive reference signal.

4. The comparator of claim 2, wherein the delay circuit further includes:

a first inverter configured to receive a first intermediate delayed clock signal from the first transistor and the second transistor;

a second inverter configured to receive a second intermediate delayed clock signal from the third transistor and the fourth transistor; and a pair of cross-coupled capacitors coupled to the first and second inverters.

5. The comparator of claim 4, wherein the pair of cross-coupled capacitors include:

a first capacitor that includes a first terminal and a second terminal; and a second capacitor that includes a third terminal and a fourth terminal; the first terminal connected to an input of the first inverter, the third terminal connected to an input of the second inverter, the second terminal connected to an output of the second inverter, and the fourth terminal connected to an output of the first inverter.

6. The comparator of claim 5, wherein the output of the first inverter is the positive delayed clock signal and the output of the second inverter is the negative delayed clock signal.

7. A delay circuit, comprising:

a first inverter coupled to a first transistor and a second transistor, the first inverter configured to receive a first intermediate delayed clock signal and generate a positive delayed clock signal to be received by a first negative-AND (NAND) gate of a comparator;

a second inverter coupled to a third transistor and a fourth transistor, the second inverter configured to receive a second intermediate delayed clock signal and generate a negative delayed clock signal to be received by a second NAND gate of the comparator; and a pair of cross-coupled capacitors coupled to the first and second inverters;

wherein:

the first transistor is connected to the second transistor in parallel;

the third transistor is connected to the fourth transistor in parallel;

the resistance of the first transistor in parallel with the second transistor determines a delay in the positive delayed clock signal; and the resistance of the third transistor in parallel with the fourth transistor determines a delay in the negative delayed clock signal;

wherein:

the first transistor includes a first gate configured to receive a positive input signal;

the second transistor includes a second gate configured to receive a negative reference signal;

the third transistor includes a third gate configured to receive a negative input signal; and the fourth transistor includes a fourth gate configured to receive a positive reference signal.

8. The delay circuit of claim 7, wherein:

the resistance of the first transistor is proportional to a voltage level of the positive input signal;

the resistance of the second transistor is proportional to a voltage level of the negative reference signal;

the resistance of the third transistor is proportional to a voltage level of the negative input signal; and the resistance of the fourth transistor is proportional to a voltage level of the positive reference signal.

9. The delay circuit of claim 7, wherein the first inverter includes a first input terminal and a first output terminal;

the second inverter includes a second input terminal and a second output terminal;

the pair of cross-coupled capacitors includes a first capacitor and a second capacitor;

the first input terminal is connected to a first terminal of the first capacitor;

the second output terminal is connected to a second terminal of the first capacitor;

the second input terminal is connected to a third terminal of the second capacitor; and the first output terminal is connected to a fourth terminal of the second capacitor.

10. The delay circuit of claim 9, wherein:

the first transistor further includes a first drain;

the second transistor further includes a second drain;

the third transistor further includes a third drain;

the fourth transistor further includes a fourth drain;

the first input terminal is connected to the first drain and the second drain; and the second input terminal is connected to the third drain and the fourth drain.

11. A comparator, comprising:

a differential input pair of transistors including a first input transistor and a second input transistor; and a delay circuit that includes:

a first inverter coupled to a first transistor and a second transistor, the first inverter configured to receive a first intermediate delayed clock signal and generate a positive delayed clock signal to be received by the first input transistor;

a second inverter coupled to a third transistor and a fourth transistor, the second inverter configured to receive a second intermediate delayed clock signal and generate a negative delayed clock signal to be received by the second input transistor; and a pair of cross-coupled capacitors coupled to the first and second inverters;

wherein:

the first inverter includes a first input terminal and a first output terminal;

the second inverter includes a second input terminal and a second output terminal;

the pair of cross-coupled capacitors includes a first capacitor and a second capacitor;

the first input terminal is connected to a first terminal of the first capacitor;

the second output terminal is connected to a second terminal of the first capacitor;

the second input terminal is connected to a third terminal of the second capacitor; and the first output terminal is connected to a fourth terminal of the second capacitor;

wherein:
the first transistor includes a first drain;
the second transistor includes a second drain;
the third transistor includes a third drain;
the fourth transistor includes a fourth drain;
the first input terminal is connected to the first drain and the second drain; and
the second input terminal is connected to the third drain and the fourth drain;

wherein:
the first transistor includes a first gate configured to receive a positive input signal;
the second transistor includes a second gate configured to receive a negative reference signal;
the third transistor includes a third gate configured to receive a negative input signal;
the fourth transistor includes a fourth gate configured to receive a positive reference signal;
the resistance of the first transistor is proportional to a voltage level of the positive input signal;
the resistance of the second transistor is proportional to a voltage level of the negative reference signal;
the resistance of the third transistor is proportional to a voltage level of the negative input signal; and
the resistance of the fourth transistor is proportional to a voltage level of the positive reference signal.

\* \* \* \* \*